United States Patent
Eberler et al.

(10) Patent No.: US 9,829,549 B2
(45) Date of Patent: Nov. 28, 2017

(54) MR ANTENNA WITH COMPENSATION FOR VARIABLE DISTANCE TO SHIELD

(71) Applicants: Ludwig Eberler, Neumarkt (DE);
Jürgen Nistler, Erlangen (DE);
Markus Vester, Nürnberg (DE)

(72) Inventors: Ludwig Eberler, Neumarkt (DE);
Jürgen Nistler, Erlangen (DE);
Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1127 days.

(21) Appl. No.: 13/890,128

(22) Filed: May 8, 2013

(65) Prior Publication Data
US 2013/0300418 A1 Nov. 14, 2013

(30) Foreign Application Priority Data
May 9, 2012 (DE) ......................... 10 2012 207 722

(51) Int. Cl.
*G01R 33/34* (2006.01)
*G01R 33/422* (2006.01)
*G01R 33/36* (2006.01)
*G01R 33/48* (2006.01)
*G01R 33/563* (2006.01)

(52) U.S. Cl.
CPC . *G01R 33/34092* (2013.01); *G01R 33/34046* (2013.01); *G01R 33/34076* (2013.01); *G01R 33/3628* (2013.01); *G01R 33/422* (2013.01); *G01R 33/4806* (2013.01); *G01R 33/56341* (2013.01)

(58) Field of Classification Search
CPC .............. G01R 33/422; G01R 33/3628; G01R 33/4806; G01R 33/34046; G01R 33/34076; G01R 33/34092; G01R 33/56341
See application file for complete search history.

(56) References Cited

U.S. PATENT DOCUMENTS

| | | | |
|---|---|---|---|
| 5,467,017 A | 11/1995 | Duerr et al. | |
| 5,483,163 A | 1/1996 | Wen et al. | |
| 5,760,583 A | 6/1998 | Sato et al. | |
| 6,943,551 B2 | 9/2005 | Eberler et al. | |

(Continued)

FOREIGN PATENT DOCUMENTS

| | | |
|---|---|---|
| CN | 1803093 A | 7/2006 |
| CN | 102309324 A | 1/2012 |

(Continued)

OTHER PUBLICATIONS

Korean Office Action for Korean Application No. 10-2013-0052216, dated Aug. 13, 2015, with English Translation.
(Continued)

*Primary Examiner* — Dixomara Vargas
(74) *Attorney, Agent, or Firm* — Lempia Summerfield Katz LLC

(57) ABSTRACT

A whole-body coil for a magnetic resonance tomography device includes one or more compensation capacitors between a high-frequency antenna and an RF shield. The one or more compensation capacitors each have variable capacitance caused by a variation in a distance of the RF shield to the high-frequency antenna.

21 Claims, 6 Drawing Sheets

(56) References Cited

U.S. PATENT DOCUMENTS

| | | | |
|---|---|---|---|
| 7,015,695 B2 * | 3/2006 | Tropp | G01R 33/34046 324/309 |
| 7,999,548 B1 * | 8/2011 | Brown | A61B 5/055 324/307 |
| 8,198,894 B2 * | 6/2012 | Kaneko | G01R 33/34046 324/307 |
| 2005/0127914 A1 | 6/2005 | Eberler et al. | |
| 2005/0270031 A1 | 12/2005 | Oppelt et al. | |
| 2006/0106302 A1 | 5/2006 | Takamori | |
| 2009/0128150 A1 | 5/2009 | Ham et al. | |
| 2009/0315556 A1 | 12/2009 | Driemel et al. | |
| 2012/0161772 A1 | 6/2012 | Biber et al. | |

FOREIGN PATENT DOCUMENTS

| | | |
|---|---|---|
| DE | 4232884 C2 | 10/1997 |
| DE | 10314215 B4 | 11/2006 |
| DE | 10314215 B4 | 11/2006 |
| JP | H0852126 A | 2/1996 |
| JP | 2007069410 A | 3/2007 |
| JP | 2008289603 A | 12/2008 |

OTHER PUBLICATIONS

German Office Action dated Jan. 14, 2013 for corresponding German Patent Application No. DE 10 2012 207 722.7 with English translation.

Chinese Office Action for Chinese Patent Application No. 201310163873 dated Feb. 22, 2016, with English Translation.

Jiang, Dong-Ping et al. "Principles of Siemens MR radiofrequency system and its troubleshooting" China Medical Equipment, 2011, No. 8, vol. (9): pp. 69-73.

Korean Notice of allowance for related Korean Application No. 102012207722.7 dated Feb. 26, 2016, with English Translation.

Xue Tingqiang et al; "Development of mobile MRI system"; Zhongguo Yi Liao Qi Xie Za Zhi= Chinese Journal of Medical Instrumentation May 2010; vol. 34; No. 3; pp. 195 197; ISSN: 1671-7104; XP009168292.

* cited by examiner

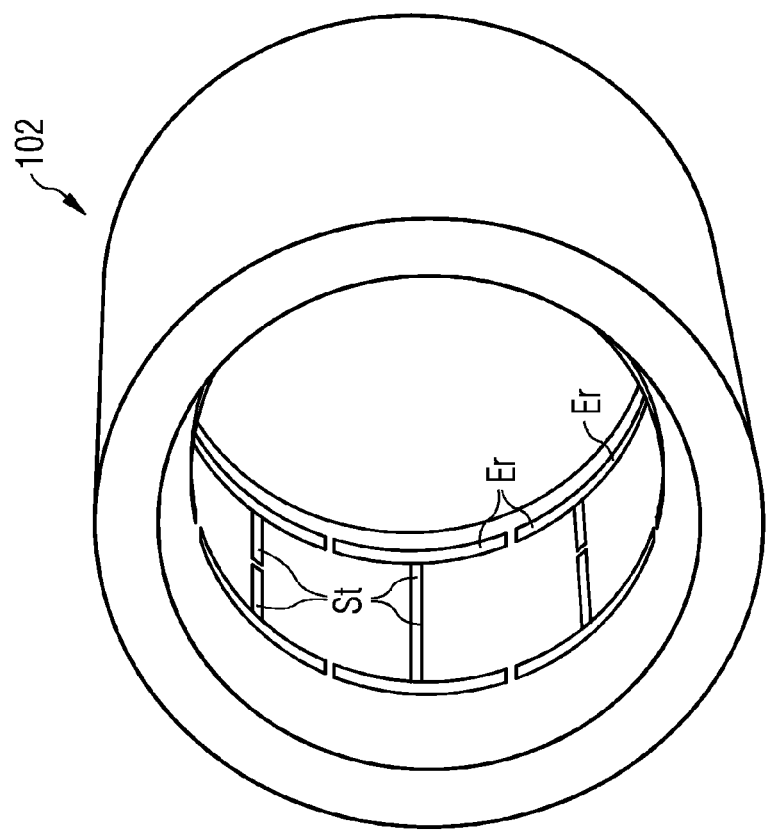
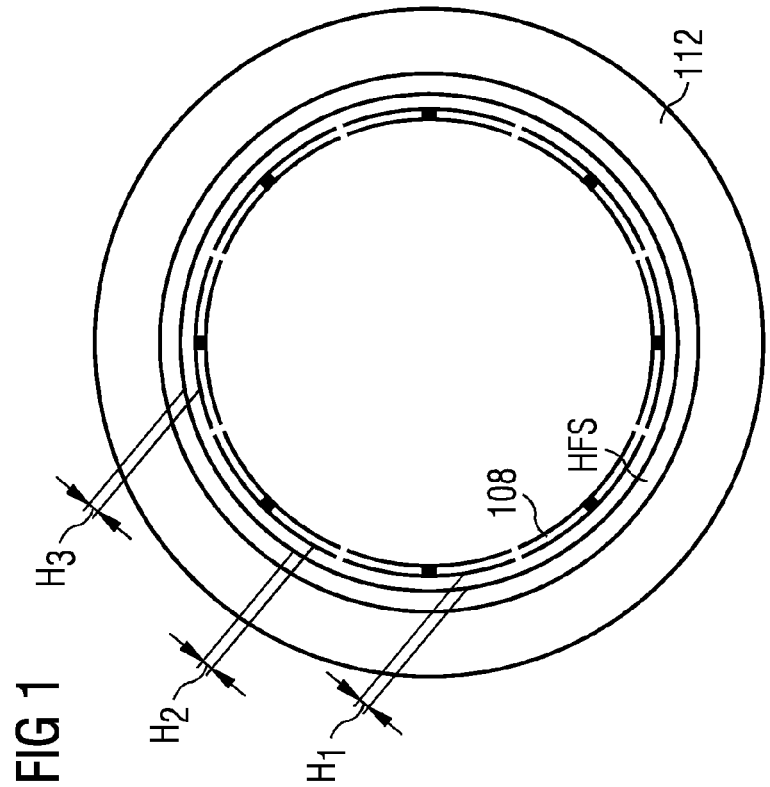
FIG 1

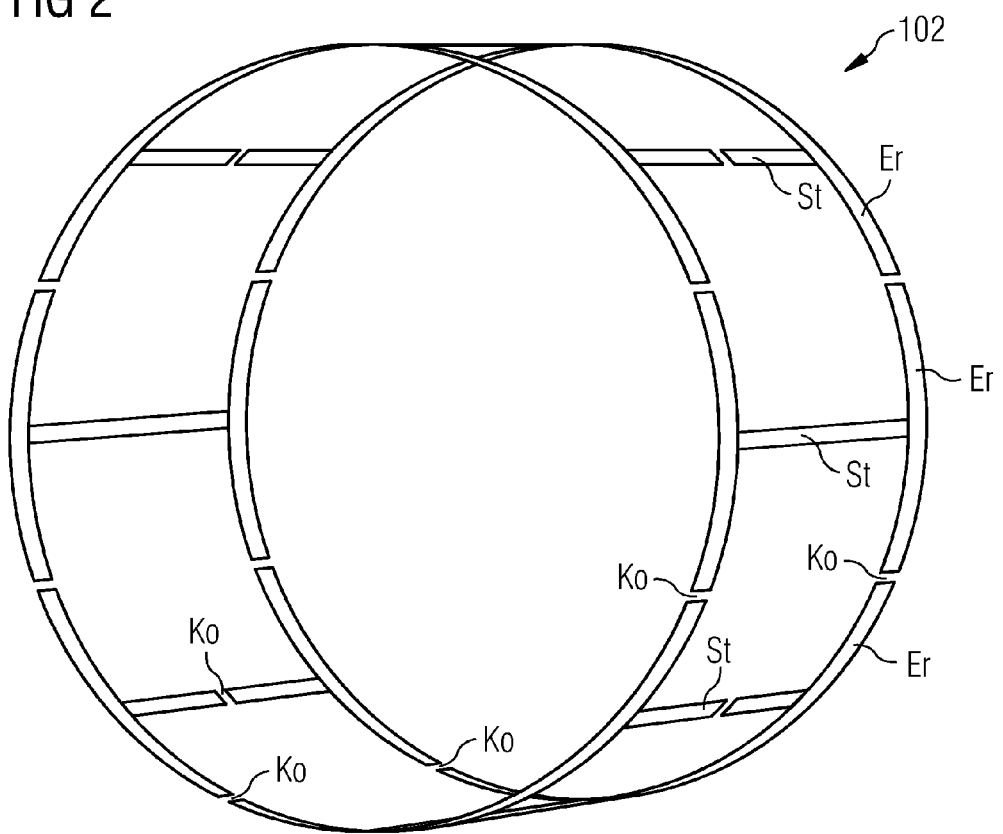

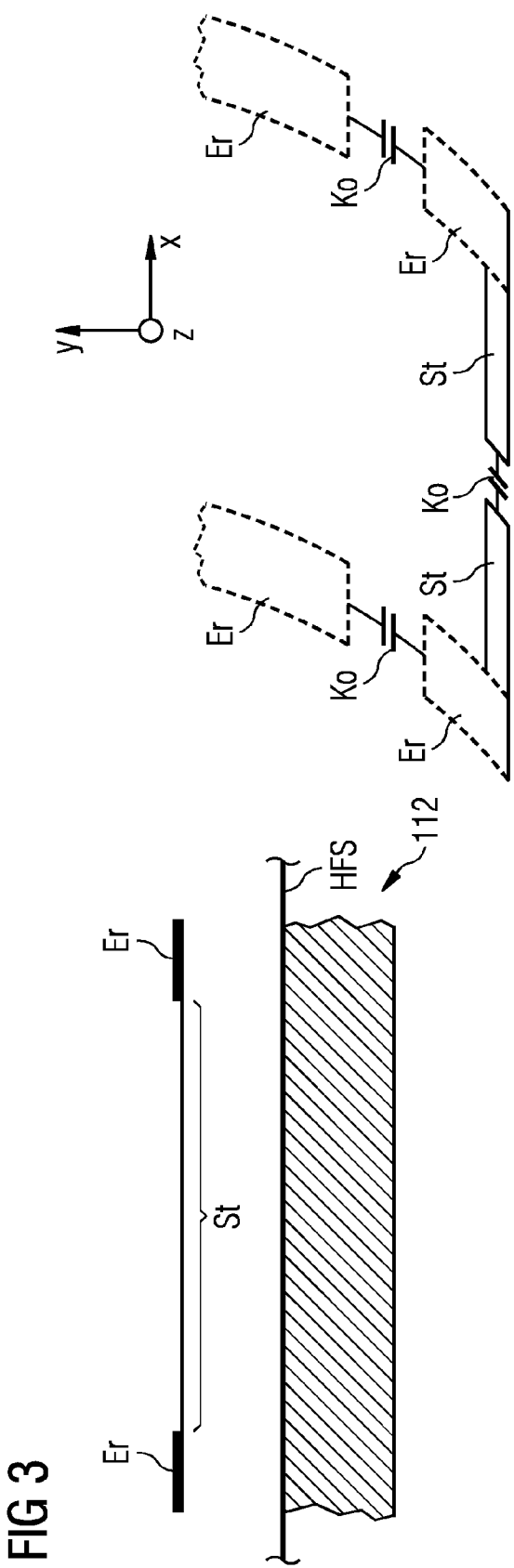

FIG 5
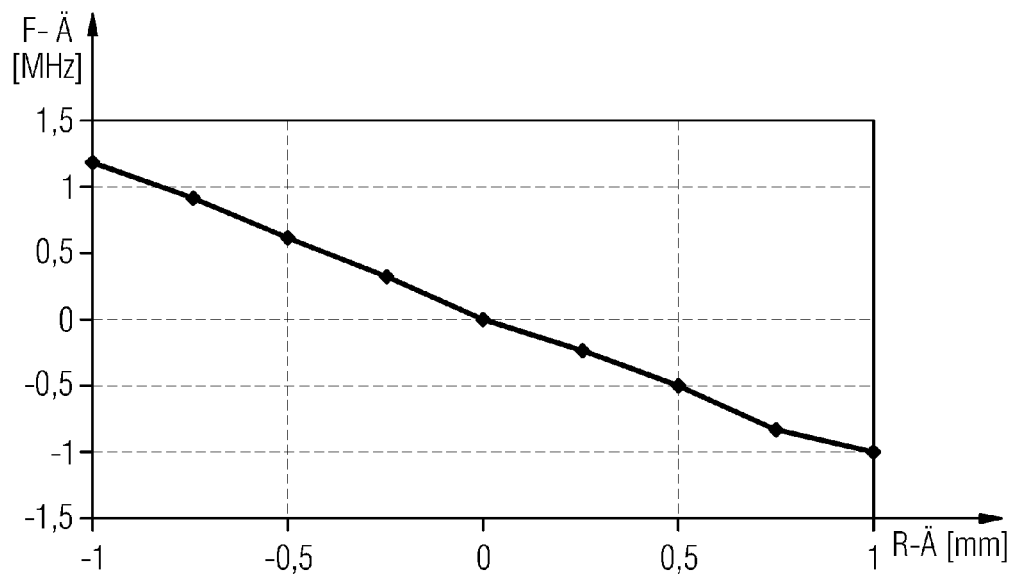
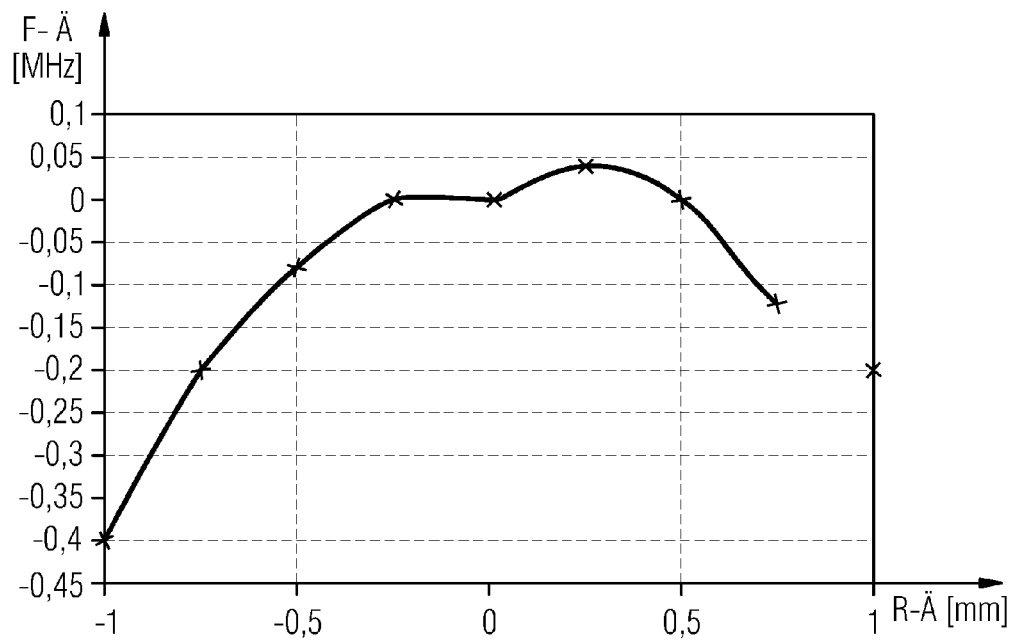

MR ANTENNA WITH COMPENSATION FOR VARIABLE DISTANCE TO SHIELD

This application claims the benefit of DE 102012207722.7, filed on May 9, 2012, which is hereby incorporated by reference.

BACKGROUND

The present embodiments relate to a whole-body coil for a magnetic resonance tomography device and an MRT.

Magnetic resonance tomography devices (MRTs) for examining objects or patients using magnetic resonance tomography are known, for example, from DE10314215B4.

SUMMARY

The scope of the present invention is defined solely by the appended claims and is not affected to any degree by the statements within this summary.

The present embodiments may obviate one or more of the drawbacks or limitations in the related art. For example, a magnetic resonance tomography device is optimized.

BRIEF DESCRIPTION OF THE DRAWINGS

FIG. 1 shows one embodiment of an arrangement with gradient coil, RF shield and transmitting antenna;

FIG. 2 shows one embodiment of an arrangement with gradient coil, RF shield and transmitting antenna;

FIG. 3 shows a cross-section through one embodiment of an antenna and a gradient coil of an MRT.

FIG. 5 shows examples of the effect of a compensation capacitor; and

DETAILED DESCRIPTION

Figure 6:
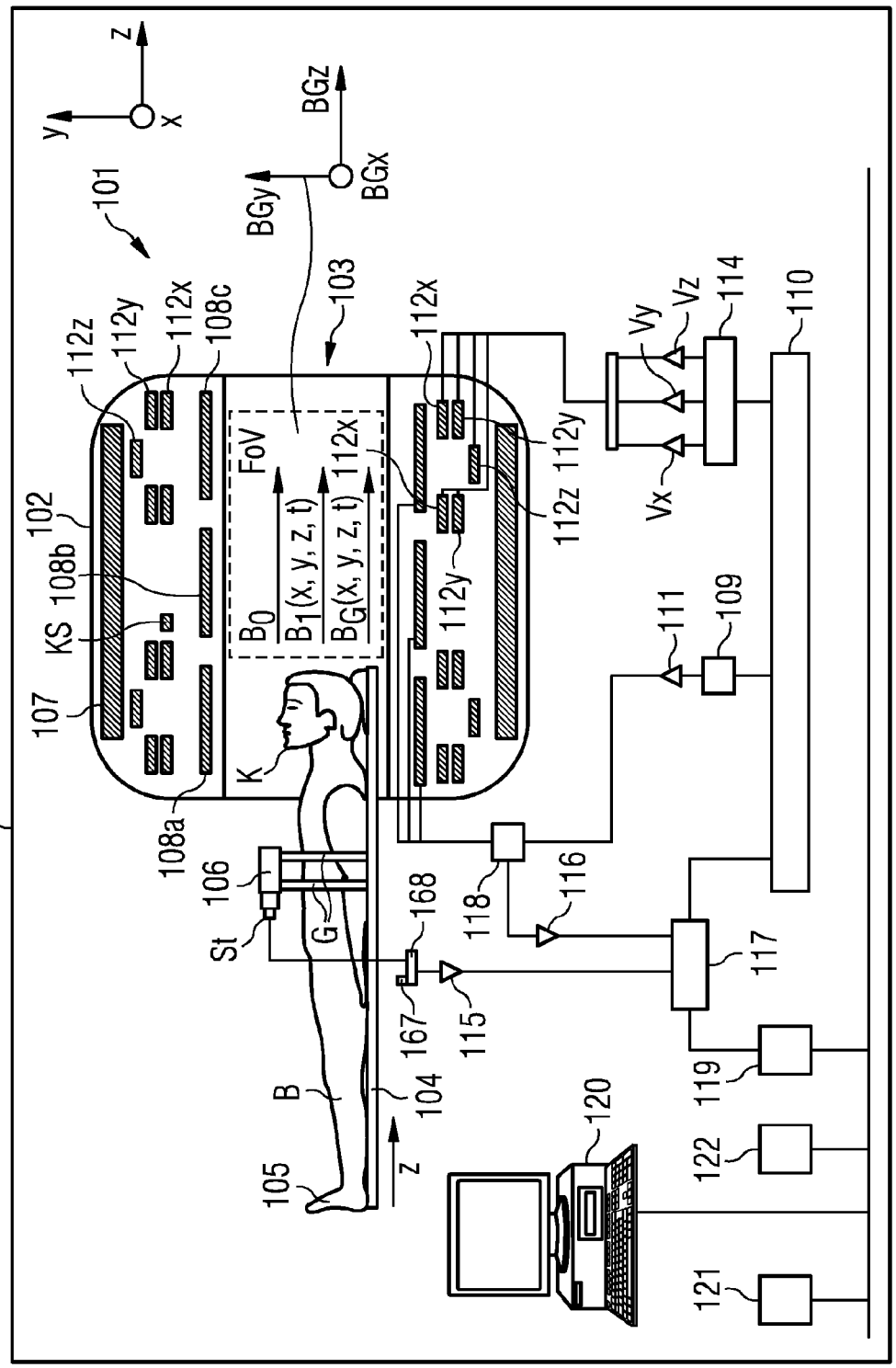
FIG. 6 is a schematic view of one embodiment of an MRT system.

FIG. 6 shows a magnetic resonance tomography imaging device MRT 101 (e.g., located in a shielded room or Faraday cage F) including a whole-body coil 102 with, for example, a cylindrical chamber 103 in which a patient couch 104 with a body 105 (e.g., of an object of investigation such as a patient; with or without a local coil arrangement 106) may be moved in the direction of the arrow z in order to generate images of the patient 105 using an imaging process. The local coil arrangement 106 is, for example, arranged on the patient. In a local region (e.g., field of view (FOV)) of the magnetic resonance tomography device (MRT), images of a part of the body 105 may be generated in the FOV by the local coil arrangement 106. Signals from the local coil arrangement 106 may be analyzed (e.g., converted into images, stored or displayed), for example, by an analysis device (e.g., including elements 168, 115, 117, 119, 120, 121) of the MRT 101 that may be connected via coaxial cable or by radio (e.g., element 167) to the local coil arrangement 106.

In order to examine the body 105 (e.g., the object of investigation or the patient) using magnetic resonance imaging using a magnetic resonance tomography device MRT 101, various magnetic fields that are precisely attuned to one another in temporal and spatial characteristics are radiated (e.g., beamed) onto the body 105. A powerful magnet (e.g., a cryomagnet 107) in a measuring cabin with, for example, a tunnel-shaped opening 103 generates a static, strong main magnetic field $B_0$, measuring, for example, 0.2 Tesla to 3 Tesla or even more. The body 105 to be examined is laid on a patient couch 104 and moved into a region of the main magnetic field B0 that is roughly homogeneous in the FoV. The nuclear spins of atomic nuclei in the body 105 are excited by magnetic high-frequency excitation pulses B1 (x, y, z, t) that are emitted via a high-frequency antenna, shown in FIG. 6 in highly simplified form as a body coil 108 (e.g., a multiple part body coil 108a, 108b, 108c; alternatively, via a local coil arrangement). High-frequency excitation pulses are generated, for example, by a pulse generation unit 109 that is controlled by a pulse sequence control unit 110. After amplification by a high-frequency amplifier 111, the high-frequency excitation pulses are routed to the high-frequency antenna 108. The high-frequency system shown in FIG. 6 is illustrated merely schematically. In other embodiments, more than one pulse generation unit 109, more than one high-frequency amplifier 111 and a plurality of high-frequency antennas 108a, b, c are used in a magnetic resonance device 101.

The magnetic resonance device 101 has gradient coils 112x, 112y, 112z, with which magnetic gradient fields $B_G(x, y, z, t)$ are emitted during a measurement for selective layer excitation and for location coding of the measurement signal. The gradient coils 112x, 112y, 112z are controlled by a gradient coil control unit 114 via amplifiers Vx, Vy, Vz that, like the pulse generation unit 109, are also connected to the pulse sequence control unit 110.

Signals emitted by the excited nuclear spins (e.g., of atomic nuclei in the object of investigation) are received by the body coil 108 and/or by at least one local coil arrangement 106, amplified by assigned high-frequency preamplifiers 116, and further processed and digitized by a receiver unit 117. The recorded measurement data is digitized and stored in a k-space matrix as complex numerical values. Once the k-space matrix contains the values, a corresponding MR image may be reconstructed from the k-space matrix by a multidimensional Fourier transformation.

For a coil that may be operated in both transmit and receive mode (e.g., the body coil 108 or a local coil 106), the correct signal forwarding is controlled by an upstream transmit-receive switch 118.

An image processing unit 119 generates, from the measurement data, an image that is displayed to a user via an operator console 120 and/or is stored in a memory unit 121. A central processor unit 122 controls the individual system components.

In MR tomography, images with high signal-to-noise ratio (SNR) may be recorded with local coil arrangements (e.g., coils, local coils). The local coil arrangements are antenna systems that are placed directly (against or adjacent) over (anterior), under (posterior), on, or in the body 105. During an MR measurement, the excited nuclei induce a voltage in the individual antennas of the local coil. The induced voltage is amplified with a low-noise preamplifier (e.g., LNA, preamp) and forwarded to the receiver electronics. High-field systems (1.5T-12T or more) are used to improve the signal-to-noise ratio even for high-resolution images. If more individual antennas may be connected to an MR receiving system than receivers are available, a switch matrix (e.g., RCCS), for example, is installed between receiving antennas and receivers. This routes the currently active receiving channels (e.g., the receiving channels that are directly in the field of view of the magnet) to the available receivers. This makes it possible to connect more coil elements than there are receivers available, since only the coils situated in the FoV or in the homogeneity volume of the magnet is to be read out in the case of whole-body coverage.

An antenna system, which may include, for example, one antenna element or an array coil including a plurality of antenna elements (e.g., coil elements) may be designated, for example, as the local coil arrangement 106. These individual antenna elements are, for example, configured as loop antennas (e.g., loops), butterfly, flex coils or saddle coils. A local coil arrangement includes, for example, coil elements, a preamplifier, further electronics (e.g., baluns), a housing, supports and may include a cable with plug by which the local coil arrangement is connected to the MRT system. A receiver 168 connected on the system side filters and digitizes a signal received from a local coil 106, for example, by radio and transfers the data to a digital signal processing device that may derive an image or spectrum from data obtained by a measurement and provides the image or spectrum to the user, for example, for subsequent diagnosis by the user and/or for storage.

Sufficient stability is important in imaging with MR systems in order to obtain reliable images for diagnosis. Certain investigation methods place particularly high demands on the stability of the system. Examples include functional imaging (FMRI) or diffusion tensor imaging (DTI). In a common and advantageous design of MR systems, the RF shield is attached to the gradient coil or is connected to the RF shield. The transmitting antenna (e.g., whole-body transmitting antenna) is disposed in front of the RF shield in the direction of the patient, and not necessarily directly connected with the RF shield mechanically.

The system and, for example, the gradient coil (e.g., the gradient coil system with coils for the x-axis, y-axis and z-axis) of the MRT may warm up and expand during MR examinations. This may lead to an increase in the distance between transmitting antenna and the RF shield. As a result of this, the properties of the antenna may vary. Inductance, for example, may be dependent on the cross-sectional area of the field reflux and, in an initial approximation, may be directly proportional to the distance between the antenna conductors and the shield. This provides primarily that the resonance frequency of the antenna elements (and thus the current in the case of a continuous power supply) and also, to a lesser extent, the efficiency (e.g., B1 field per current) may vary.

The variation in radial distance to the shield may be uniform around the circumference. In the case of thermally unequally loaded transverse gradients (x versus y), however, an angle-dependent deformation (e.g., ellipticity) of the shield may occur. In normal circular-polarized antennas, this may, for the two orthogonal polarizations, lead to a different detuning, or even to a coupling of the corresponding feed ports. Such variations are not compensated for by a 90° hybrid that may be switched between transmission amplifier and antennas. The variations may therefore appear at the output of the transmission amplifier, and the reciprocal effect with the output impedance may worsen the variation in the B1 field.

With regard to MRT imaging, this provides that the RF output recorded from the antenna (and the patient) varies, and the B1 field thereby generated varies. The image quality of many sequences depends on the generated flip angle where the spin is excited; if the B1 field varies, then the flip angle and the B1 field strengths vary. In addition to an absolute scaling of the B1 field strengths, a variation in the spatial distribution may also occur in the flip angle. Overall, this results in reductions in image quality. In individual cases, it may no longer be possible for certain applications to be carried out (e.g., depending on the intensity of the effect). Irrespective of the thermal drift there is also a statistical variability in the inner radii of a gradient coil, caused by manufacturing tolerances. This provides that the resonance frequencies and the decoupling of the subantennas are to be coordinated following installation in the gradient coil.

Possible solutions that have been considered include that the RF shield is separated from the gradient coil and forms a mechanical unit together with the transmitting antenna. This is difficult to apply for systems with a large patient bore diameter (e.g., 70 cm, "Open Bore"), since limited space is available between gradient coil and shield. The possible solutions also include B1 field control. The generated B1 field is measured and kept constant with an appropriate control loop (e.g., "Cartesian feedback loop").

Other solutions may be more optimum than these previously considered solution. In one embodiment, an antenna arrangement is essentially insensitive toward diameter variations in the gradient coil 112, and therefore toward variations (e.g., variable at different positions) in the distances H1, H2, H3 from the RF shield HFS to the high-frequency coil system 108.

It is known from measurement data that under extreme conditions, the diameter of the gradient coil may vary by, for example, about 1 mm Even though the variation with regard to the absolute diameter is less than 0.2 percent, what matters is the variation with reference to the distance from the RF shield to the HF transmitting antenna (e.g., mounted on the gradient coil), which is, for example, in the region of 1-3 percent.

FIG. 1 shows in simplified form (e.g., in the cross-section on the left of FIG. 1 and in the perspective view on the right of FIG. 1) a view of one embodiment of an MRT body coil arrangement 102 with a gradient coil 112, an RF shield HFS (e.g., mounted on the MRT body coil arrangement) and an HF transmitting antenna 108.

FIG. 2 shows exemplary rods St and ferrule segments Er of a whole-body antenna arrangement 102 (birdcage) of an MRT 101, which are each connected, for example, by capacitors Ko and tuned to a required resonance frequency. The capacitors Ko are located, for example, in the rods St and/or between the ferrule segments Er.

FIG. 3 shows, on the left, in a cross-section through a whole-body antenna arrangement 102 (radially from the outside inward), one embodiment of a gradient coil 112 of an MRT, an RF shield HFS disposed on the gradient coil 112 of the MRT, and ferrules Er and a rod St (e.g., including one or more parts) of an HF antenna 108 (partially shown). On the right of FIG. 3 is a partial perspective view of capacitors Ko between ferrule parts Er and rod parts St of a rod of an HF antenna 108.

Figure 4A:
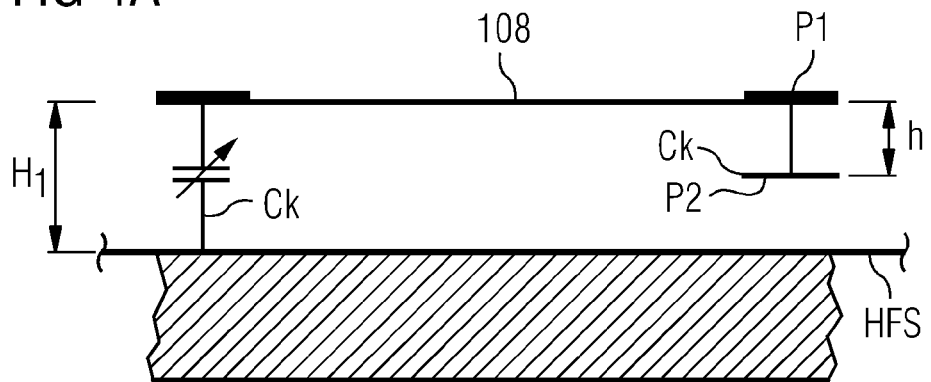
FIG. 4a shows a cross-section of one embodiment of an arrangement with compensation capacitors.
Figure 4B:
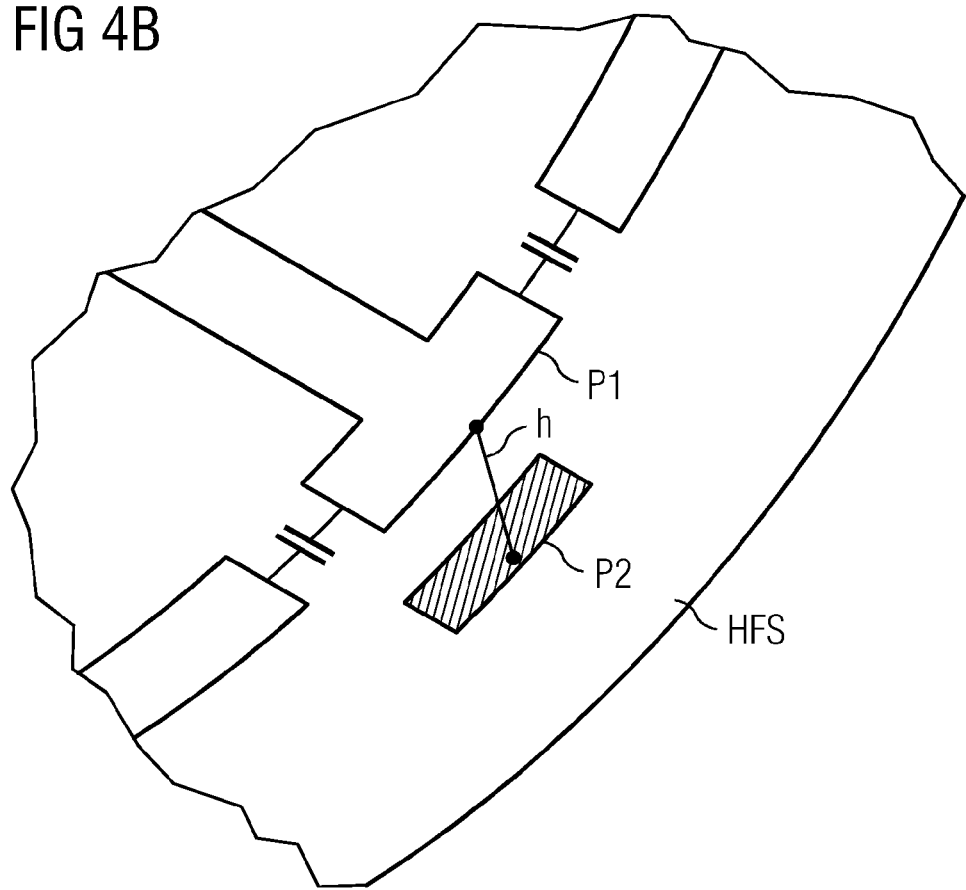
FIG. 4b shows a perspective view of one embodiment of an arrangement with a compensation capacitor.

FIG. 4a shows schematically, in simplified form, one embodiment of compensation capacitors Ck between an RF shield HFS (e.g., attached and/or mounted on and/or fixed to a gradient coil 112) and an HF coil system 108. The left-hand side of FIG. 4a shows the compensation capacitors Ck schematically as a circuit diagram of an adjustable capacitor, and the right-hand side of FIG. 4a shows the compensation capacitors Ck, by way of example, as a plate capacitor with two plates P1 and P2, with the distance between the plates being labeled as h.

A whole-body antenna 102 is therefore supplemented, for example, by one or more compensation capacitors Ck (e.g., capacitors that may be used to compensate for variations in the oscillating circuit caused by distance variations) that are disposed between the HF antenna 108 and the RF shield HFS and form an "adjustable" capacitor, so that the mechanical variations (e.g., thermal expansions when heated through operation and therefore variations in the distance H) in the gradient coil 112 are compensated for at least in part (e.g., as shown on the right of FIG. 4a, may be configured (in each case) as plate capacitors). The variation in capacitance of a compensation capacitor Ck may in each case result solely from the variation in distance (e.g., H1, H2, H3) from the HF coil 108 to the RF shield HFS (e.g., mounted on the gradient coil). Therefore, the compensation for heat-related variations of distances H1, H2, H3 may each occur independently in a region (e.g., from RF shield HFS and HF spool arrangement and defined by an element St, Er of the HF antenna 108) and as compensation for variably-sized heat-related variations of distances H1, H2, H3, each in a region (e.g., from RF shield HFS and HF spool arrangement and defined by an element St, Er of the HF antenna 108).

For each linear polarized subsystem of the antenna 112, at least two compensation capacitors Ck, for example, may be provided. A maximum of one compensation capacitor Ck, for example, per ferrule segment Er may be present.

These compensation capacitors Ck (e.g., with plates P1 and P2 with plate distance h) are configured, for example, so that, as the distance H1, H2, H3 of the antenna elements St, Er (of the HF coil 108) from the shield HFS increases, the capacitance is reduced in each case by approximately the amount that the increased inductance (e.g., of HFS and 108) is compensated for and/or the resonance frequency (e.g., of the birdcage or of the HF antenna 108) remains constant. In the case of a relative distance variation dh/h, a relative inductivity variation dL/L~dh/h is therefore to be compensated for, for example, by a relative capacitance variation dC/C=dL/L~-dh/h.

In one embodiment, only a part of the entire resonating capacitance C is configured as a compensation capacitor Ck. This may experience a correspondingly greater relative variation dCk/Ck=C/Ck*dC/C~-C/Ck*dh/h.

This may be achieved in that at least one plate P1, P2 of the compensation capacitor Ck is configured as an element Er, St of the HF antenna and/or as a capacitor plate P1, P2 mounted on the RF shield HFS, which experiences the same absolute or relative distance variation dh of the distance h (e.g., RF shield and HF spool system to one another) to the other plate of the compensation capacitor, but is attached (e.g., with a fixing, support) more closely (e.g., than the distance H from RF shield and HF coil) to the RF shield (or the HF antenna; distance hk<h). This results in the criterion hk~h*Ck/C for the choice of distance hk.

If, for example, half of the overall capacitance is applied through the plates, these may be located approximately half the distance from the RF shield as the live conductors of the HF antenna.

In the case of a TEM resonator, the resonance capacitance is located, for example, between the ends of the rods and the surface of the shield, and the voltage on the fixed capacitors is equivalent, for example, to the voltage on the compensation capacitors.

In a birdcage, however, the capacitors are configured, for example, as series capacitance that is introduced into the current flow in the rods (low-pass) and/or in the ferrules (high-pass). The compensation process may also be used in this case. When estimating the values for the compensation capacitors, the effect of the capacitors is to be weighted with the stored energy and therefore with the square of the applied voltage: $dCkl/k = -dL/L*(u1^2 C1 + u2^2 C2 + \ldots uk^2 Ck)/(uk^2 Ck)$.

Precise dimensioning may be carried out with numerical calculation processes (e.g., finite elements, perturbation).

For a multichannel controllable antenna (e.g., degenerate birdcage for TX array), the voltages on the capacitors are dependent, for example, on the selected mode m. For each transmit mode, the energies $un(m)^2 Cn$ of all involved capacitances Cn are summated, and thus the distance and size of the compensation capacitors are dimensioned so that each mode is separately compensated for.

The tuning of the HF antenna may lose or reduce sensitivity to changes in diameter of the gradient coil. Thus, resonance frequency, decoupling of the subsystems, and absorbed power may remain constant even when the gradient coil heats up. The generated B1 field and thus the flip angle may remain approximately/virtually constant for the duration of the examinations. The temporal stability and image quality may be improved.

Time-consuming individual tuning of the antenna after installation in the gradient coil may be reduced or dispensed with.

The graphs at the top and bottom of FIG. 5 show a possible effect of at least one compensation capacitor, as a frequency variation F-A in MHz of the antenna as a function of a radius variation R-A of a gradient coil in mm In the example at the top of FIG. 5 (e.g., without compensation capacitor), for an investigated configuration with a radius variation of the gradient coil of +−1 mm, the resonance frequency of the antenna varies by somewhat more than +−1 MHz. The example at the bottom of FIG. 5 (e.g., with compensation capacitors) shows a clear reduction in frequency variation. For radius variations up to 0.5 mm, this frequency variation remains smaller than 50 kHz. Only above this do variations of up to 0.4 MHz occur.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A whole-body coil for a magnetic resonance tomography device, the whole-body coil comprising:
    one or more compensation capacitors between a high-frequency antenna and an RF shield,
    wherein each of the one or more compensation capacitors has a variable capacitance caused by a variation in a distance of the RF shield to the high-frequency antenna,
    wherein the RF shield is arranged on a gradient coil, mounted on the gradient coil, fixed to the gradient coil, or a combination thereof, and wherein the distance of the RF shield to the high-frequency antenna varies during expansion of the gradient coil.

2. The whole-body coil as claimed in claim 1, wherein the one or more compensation capacitors are each configured as a plate capacitor.

3. The whole-body coil as claimed in claim 1, wherein the one or more compensation capacitors are each configured as a plate capacitor,
wherein plates of the plate capacitor have a distance to one another, the distance in each case being variable by expansion of the gradient coil, by distance variation of the distance of the RF shield to an element of the high-frequency antenna, or a combination thereof.

4. The whole-body coil as claimed in claim 1, wherein the one or more compensation capacitors comprise a plurality of compensation capacitors,
wherein each compensation capacitor of the plurality of compensation capacitors has a number of varying capacitances with a number of varying distances, in a plurality of regions, from a gradient coil that is expandable as a result of heating to the high-frequency antenna.

5. The whole-body coil as claimed in claim 1, wherein the capacitance of each compensation capacitor of the one or more compensation capacitors is variable only based on a distance variation of the distance of the RF shield to an element of the high-frequency antenna.

6. The whole-body coil as claimed in claim 1, wherein a compensation capacitor of the one or more compensation capacitors is configured so that, when the distance from an element of the high-frequency antenna to the RF shield increases, the capacitance of the compensation capacitor is reduced to the extent that any increase in inductance is compensated for in full or in part.

7. The whole-body coil as claimed in claim 1, wherein only a part of an entire resonance capacitor of the high-frequency antenna is configured in the form of the one or more compensation capacitors.

8. The whole-body coil as claimed in claim 1, wherein each of the one or more compensation capacitors has a capacitive plate attached to, connected to, or attached and connected to an element of the high-frequency antenna, a capacitive plate attached to, connected to, or attached and connected to the RF shield or a gradient system, or a combination thereof.

9. The whole-body coil as claimed in claim 1, wherein each of the one or more compensation capacitors has a capacitive plate attached to an element of the high-frequency antenna, the capacitive plate being attached more closely to the RF shield than to the high-frequency antenna or more closely to the high-frequency antenna than to the RF shield.

10. The whole-body coil as claimed in claim 1, wherein the one or more compensation capacitors are located less remotely from the RF shield than elements of the high-frequency antenna by a factor or a reciprocal value, the factor corresponding to the capacitance of the one or more compensation capacitors as a proportion of the entire resonance capacitance of the radio frequency shield, the high-frequency antenna, or the radio frequency shield and the high-frequency antenna.

11. The whole-body coil as claimed in claim 1, wherein in a magnetic resonance tomography device in the form of a TEM resonator, the resonance capacitance of the RF shield, the high-frequency antenna, or the RF shield and the high-frequency antenna is located between ends of rods and a surface of the RF shield, a voltage on capacitors between rods and ferrule segments is equal to a voltage on the one or more compensation capacitors, or a combination thereof.

12. The whole-body coil as claimed in claim 1, wherein in a magnetic resonance tomography device in the form of a birdcage, the one or more compensation capacitors are configured as a series capacitance that is introduced into current flow in rods, in ferrules, or in the rods and in the ferrules.

13. The whole-body coil as claimed in claim 1, wherein the high-frequency antenna is a multichannel controllable HF antenna,
wherein in the multichannel controllable HF antenna, voltages on the one or more compensation capacitors depend on a selected transmit mode, and
wherein for each transmit mode, energies of a sum of all involved capacitances, distances, surfaces of the one or more compensation capacitors, or a combination thereof is dimensioned so that each transmit mode is separately compensated for.

14. The whole-body coil as claimed in claim 1, wherein a distance of the RF shield to the high-frequency transmitting antenna, a distance between plates of a compensation capacitor of the one or more compensation capacitors, or a combination thereof is variable in each case by one to three percent.

15. The whole-body coil as claimed in claim 1, wherein the one or more compensation capacitors comprise at least two compensation capacitors, the at least two compensation capacitors being provided for each linearly polarized subsystem of the HF antenna.

16. The whole-body coil as claimed in claim 1, wherein a maximum of one compensation capacitor of the one or more compensation capacitors is available for each ferrule segment of a plurality of ferrule segments of a birdcage antenna of the magnetic resonance tomography device.

17. A magnetic resonance tomography device comprising:
a whole-body coil comprising:
one or more compensation capacitors between a high-frequency antenna and an RF shield,
wherein each of the one or more compensation capacitors has a variable capacitance caused by a variation in a distance of the RF shield to the high-frequency antenna,
wherein the RF shield is arranged on a gradient coil, mounted on the gradient coil, fixed to the gradient coil, or a combination thereof, and
wherein the distance of the RF shield to the high-frequency antenna varies during expansion of the gradient coil.

18. The whole-body coil as claimed in claim 17, wherein the one or more compensation capacitors are each configured as a plate capacitor.

19. A whole-body coil for a magnetic resonance tomography device, the whole-body coil comprising:
one or more compensation capacitors between a high-frequency antenna and an RF shield,
wherein each of the one or more compensation capacitors has a variable capacitance caused by a variation in a distance of the RF shield to the high-frequency antenna,
wherein the one or more compensation capacitors comprise a plurality of compensation capacitors, and
wherein each compensation capacitor of the plurality of compensation capacitors has a number of varying capacitances with a number of varying distances, in a plurality of regions, from a gradient coil that is expandable as a result of heating to the high-frequency antenna.

20. A whole-body coil for a magnetic resonance tomography device, the whole-body coil comprising:
one or more compensation capacitors between a high-frequency antenna and an RF shield,
wherein each of the one or more compensation capacitors has a variable capacitance caused by a variation in a distance of the RF shield to the high-frequency antenna, and
wherein a compensation capacitor of the one or more compensation capacitors is configured so that, when the distance from an element of the high-frequency antenna to the RF shield increases, the capacitance of the compensation capacitor is reduced to the extent that any increase in inductance is compensated for in full or in part.

21. A whole-body coil for a magnetic resonance tomography device, the whole-body coil comprising:
one or more compensation capacitors between a high-frequency antenna and an RF shield,
wherein each of the one or more compensation capacitors has a variable capacitance caused by a variation in a distance of the RF shield to the high-frequency antenna, and
wherein the one or more compensation capacitors are located less remotely from the RF shield than elements of the high-frequency antenna by a factor or a reciprocal value, the factor corresponding to the capacitance of the one or more compensation capacitors as a proportion of the entire resonance capacitance of the radio frequency shield, the high-frequency antenna, or the radio frequency shield and the high-frequency antenna.

* * * * *